United States Patent
Fukunaga et al.

(10) Patent No.: US 7,872,490 B2
(45) Date of Patent: Jan. 18, 2011

(54) SEMICONDUCTOR INTEGRATED CIRCUIT AND METHOD FOR TESTING THE SAME

(75) Inventors: Masayasu Fukunaga, Yokohama (JP); Hideaki Konishi, Yokahama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/659,760

(22) Filed: Mar. 19, 2010

(65) Prior Publication Data
US 2010/0213970 A1    Aug. 26, 2010

(30) Foreign Application Priority Data
Mar. 24, 2009    (JP)    ................................ 2009-72018

(51) Int. Cl.
H03K 19/00    (2006.01)
G01R 31/28    (2006.01)
(52) U.S. Cl. ............................. 326/16; 326/93; 714/726
(58) Field of Classification Search .................. 326/16, 326/93; 714/724, 726
See application file for complete search history.

(56) References Cited
U.S. PATENT DOCUMENTS
2009/0273383 A1 *  11/2009  Takatori et al. ............. 327/218

FOREIGN PATENT DOCUMENTS
JP    10-197603    7/1998
JP    11-108999    4/1999

* cited by examiner

Primary Examiner—Daniel D Chang
(74) Attorney, Agent, or Firm—Staas & Halsey LLP

(57) ABSTRACT

A semiconductor integrated circuit includes a plurality of clock gating circuits, a plurality of flip-flops to which transmission of a clock signal is controlled by a respective clock gating circuit, and a clock gating control circuit that controls an active state and an inactive state of the plurality of clock gating circuits, wherein during a test operation mode, the clock gating control circuit controlling the active state and the inactive state of the plurality of clock gating circuits according to a user logic signal, and controlling setting of an arbitrary combination of clock gating circuits to an inactive state regardless of the user logic signal.

16 Claims, 9 Drawing Sheets

FIG. 3

MODE SIGNALS AND FUNCTIONS

| MODE SIGNAL NAME | FUNCTION | SIGNAL VALUE | OPERATION |
|---|---|---|---|
| TMS | SWITCH BETWEEN TEST OPERATION AND NORMAL OPERATION | 0 | NORMAL OPERATION |
| | | 1 | TEST OPERATION |
| SMS | SWITCH BETWEEN SHIFT OPERATION AND CAPTURE OPERATION DURING SCAN TEST | 0 | CAPTURE OPERATION |
| | | 1 | SHIFT OPERATION |
| MS1 | SELECT WHETHER OR NOT CGC CONTROL CIRCUIT IS USED | 0 | USE USER LOGIC AND CGC CONTROL CIRCUIT |
| | | 1 | USE USER LOGIC |
| MS2 | SELECT DECODER TYPE TO BE USED | 0 | USE FIRST DECODER |
| | | 1 | USE SECOND DECODER |
| AOS | SELECT WHETHER OR NOT CLOCK SIGNAL IS TRANSMITTED TO ALL FF | 0 | TRANSMIT CLOCK SIGNAL ACCORDING TO USER LOGIC AND CGC CONTROL CIRCUIT LOGIC |
| | | 1 | TRANSMIT CLOCK SIGNAL TO ALL FF FORCIBLY |

| FIRST DECODER (1 HOT-DECODER) | | | | |
|---|---|---|---|---|
| INPUT | | OUTPUT | | |
| in11 | in12 | out11 | out12 | out13 |
| 0 | 0 | 0 | 0 | 1 |
| 0 | 1 | 0 | 1 | 0 |
| 1 | 0 | 1 | 0 | 0 |
| 1 | 1 | 0 | 0 | 0 |

| SECOND DECODER (2 HOT-DECODER) | | | | |
|---|---|---|---|---|
| INPUT | | OUTPUT | | |
| in21 | in22 | out21 | out22 | out23 |
| 0 | 0 | 0 | 1 | 1 |
| 0 | 1 | 1 | 0 | 1 |
| 1 | 0 | 1 | 1 | 0 |
| 1 | 1 | 0 | 0 | 0 |

FIG. 7

| OPERATION MODE | | INPUT | | | | | | OUTPUT | | | |
|---|---|---|---|---|---|---|---|---|---|---|---|
| | | TMS | SMS | MS1 | MS2 | AOS | Cnt0 | Cnt1 | Cnt1 | Cnt1 | Cnt3 |
| DURING NORMAL OPERATION | | 0 | X | X | X | X | 0 | 1 | 1 | 1 | 1 |
| DURING TEST OPERATION | DURING SCAN SHIFT | 1 | 1 | X | X | X | 1 | X | X | X | X |
| | THROUGH MODE | 1 | 0 | 1 | X | 0 | 0 | 1 | 1 | 1 | 1 |
| | 1 HOT MODE | 1 | 0 | 0 | 0 | 0 | 0 | ARBITRARY ONE OF THREE IS "1" AND OTHER ARE "0" | | | |
| | 2 HOT MODE | 1 | 0 | 0 | 1 | 0 | 0 | ARBITRARY TWO OF THREE ARE "1" AND OTHER IS "0" | | | |
| | ACTIVE MODE | 1 | 0 | X | X | 1 | 1 | X | X | X | X |

SEMICONDUCTOR INTEGRATED CIRCUIT AND METHOD FOR TESTING THE SAME

CROSS-REFERENCE TO RELATED APPLICATIONS

This application is based upon and claims the benefit of priority from the prior Japanese Patent Application No. 2009-72018 filed on Mar. 24, 2009, the entire contents of which are incorporated herein by reference.

FIELD

The embodiments discussed herein are directed to a semiconductor integrated circuit and a method for testing the same.

BACKGROUND

Higher functions and integration of semiconductor integrated circuits (LSI) are being achieved. Conventionally, this has resulted in excessive power consumption and an IR drop during the LSI operation.

In other words, a major cause of excessive power consumption and IR drop during an LSI operation is that clock signals are fed into many flip-flops (FF) provided in a circuit substantially simultaneously and thereby the FFs operate substantially simultaneously.

Conventionally, in LSI designing, the number of FFs that operate substantially simultaneously is limited by using a clock gating circuit (CGC: Clock Gating Circuit) that achieves a clock gating technique.

A circuit operation during a test may be very different from that of a normal operation, thus the power consumption and the IR drop may be much different, i.e., much larger than expected during the designing, and this may be a cause for an error.

Conventionally, LSIs have been provided that may reduce power consumption using the clock signal gating technique, however, the technique that is applied during a normal operation may not be effective during a test operation. Accordingly, excessive power consumption and an IR drop may result.

Conventionally, various methods have been proposed for testing a semiconductor integrated circuit to which a clock signal gating technique is applied.

SUMMARY

According to aspects of embodiments, a semiconductor integrated circuit includes a plurality of clock gating circuits, a plurality of flip-flops to which transmission of a clock signal is controlled by a respective clock gating circuit, and a clock gating control circuit that controls an active state and an inactive state of the plurality of clock gating circuits; wherein, during a test operation mode, the clock gating control circuit controls the active state and the inactive state of the plurality of clock gating circuits according to a user logic signal, and controls setting of an arbitrary combination of clock gating circuits to an inactive state regardless of the user logic signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 illustrates mode signals in a semiconductor integrated circuit according to an exemplary embodiment;

FIG. 7 illustrates a relationship between operation modes in a semiconductor integrated circuit according to an exemplary embodiment and input and output values in a control signal generation circuit;

ESCRIPTION OF EMBODIMENTS

Conventionally, LSIs may utilize a clock gating technique. However, effects of low power consumption may not been utilized during a test operation, and large power consumption and occurrence of an IR drop due to the higher power consumption have become problems.

Figure 1:
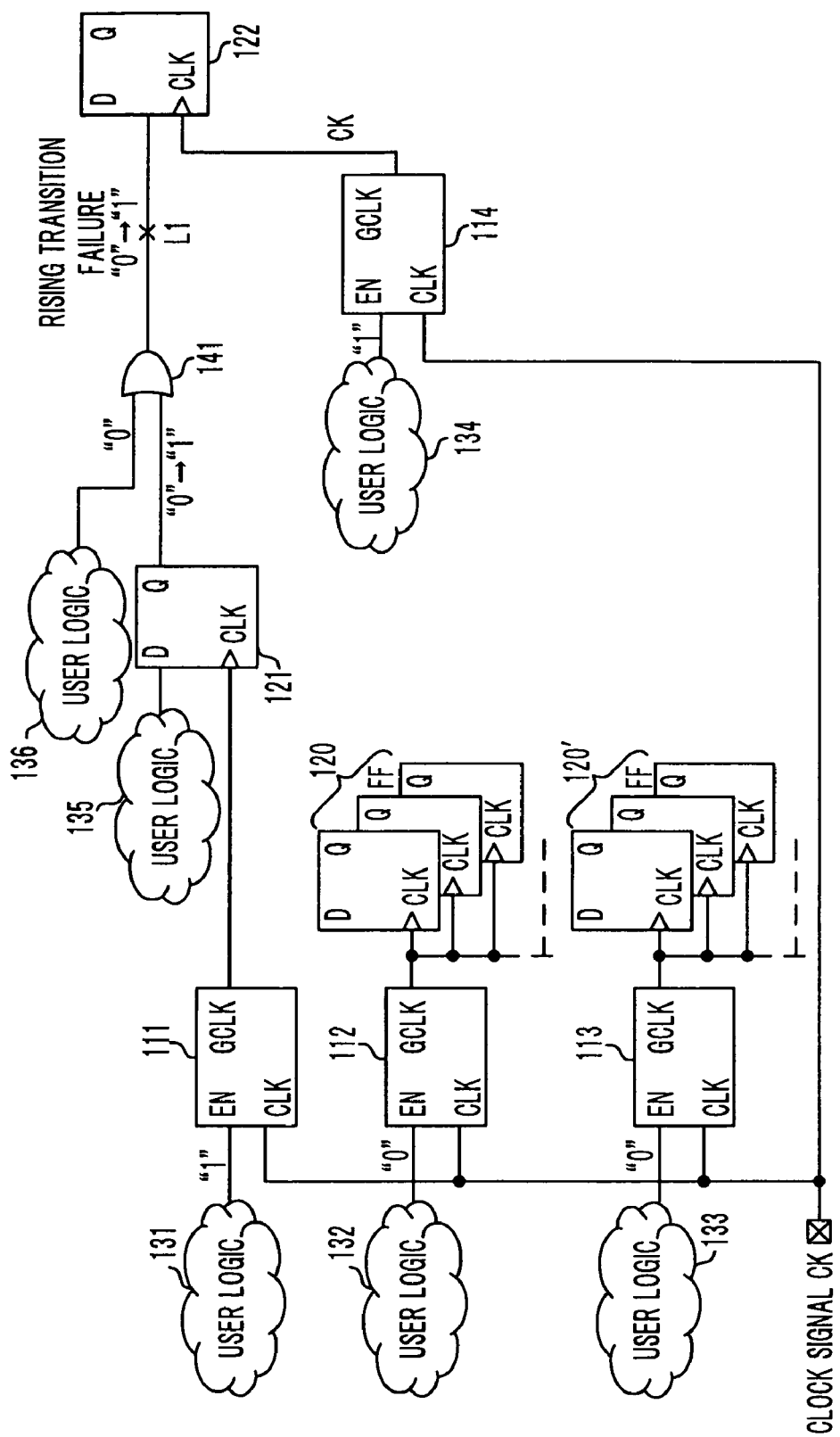
FIG. 1 illustrates an exemplary semiconductor integrated circuit (LSI) to be tested.

An exemplary semiconductor integrated circuit to be tested is illustrated in FIG. 1.

Conventionally, LSIs may be designed so that the number of FFs operated substantially simultaneously is limited by using a clock gating circuit that achieves a clock gating technique.

However, there are drawbacks when a clock gating circuit is used during a LSI test operation in order to reduce power consumption and suppress an IR drop.

FIG. 1 illustrates an exemplary semiconductor integrated circuit (LSI) to be tested.

In FIG. 1, the reference characters 111 to 114 indicate clock gating circuits (CGC), 120, 120', 121, and 122 indicate flip-flops (FF), 131 to 136 indicate user logics, and 141 indicates an OR gate.

FF120 indicates a plurality of flip-flops controlled by CGC112, and FF120' indicates a plurality of flip-flops controlled by CGC113.

Setting each of enable terminals EN of CGC111 to 114, for example, to "1" (high level "H") turns the CGCs into active states and causes clock signals CK to be transmitted to the next FFs as is.

On the other hand, setting each of enable terminals EN, for example, to "0" (low level "L") turns the CGCs into an inactive state and clock signals CK are not transmitted to the next FF.

For example, enable terminals EN of CGC111 and CGC114 need to be set to "1" to turn the CGCs into active states in order to detect (test) a rising transition failure of a signal line L1 in FIG. 1.

In other words, in order to test a rising transition failure of the signal line L1 in FIG. 1, the CGC111 is turned into an active state to transmit a clock signal to FF121 and CGC114 is turned into an active state to transmit a clock signal to FF122.

For example, when a signal from user logic 136 is "0", a Q output of FF121 is changed from "0" to "1", and a value of the signal line L1 is captured by FF122 with a clock signal CK. Whether any rising transition failure exists in the signal L1 is determined by the Q output of the FF122.

The number of FFs that operate substantially simultaneously should be reduced as much as possible to suppress power consumption and an IR drop when a rising transition failure of the signal line L1 is tested.

For example, it may be desirable to set enable terminals EN (EN terminal) of CGC112 and CGC113 to "0" to turn CGC112 and CGC113 into inactive states and stop transmission of all clock signals to a plurality of the FF120 and 120'.

In other words, operations of all of the FF120 and 120' may be stopped to suppress power consumption and IR drop by stopping transmission of clock signals to the FF120 and FF120'.

However, various user logics may not be independent, and, for example, when there is overlapped logic among user logics 131, 132, and 133, a plurality of the FF120 and 120' may not be stopped due to the influence of the overlapped logic.

In other words, when a signal supplied to the EN terminal of CGC111 from the user logic 131 is set to "1", signals which may be supplied to the EN terminals of the CGC112 and CGC113 from the user logics 132 and 133 may not be set to "0."

In the LSI illustrated in FIG. 1, user logics coupled to an EN terminal of a CGC inserted during the designing are assumed to be used during the test, thus the number of FFs substantially simultaneously operate depends on the user logic.

Thus, for example, operations of a plurality of FF120 and FF120' controlled by the CGC112 and CGC113 may not be stopped and many FFs that are irrelevant to test a specific failure may be operated substantially simultaneously and an increase in power consumption and an IR drop may be caused.

Even if setting is made so that "0" is output from the user logics 132 and 133, logical computation for generating logics thereof will be increased and the number of test patterns and time for generating patterns may be increased as well.

Preferred embodiments of the present invention will be explained with reference to accompanying drawings.

Figure 2:
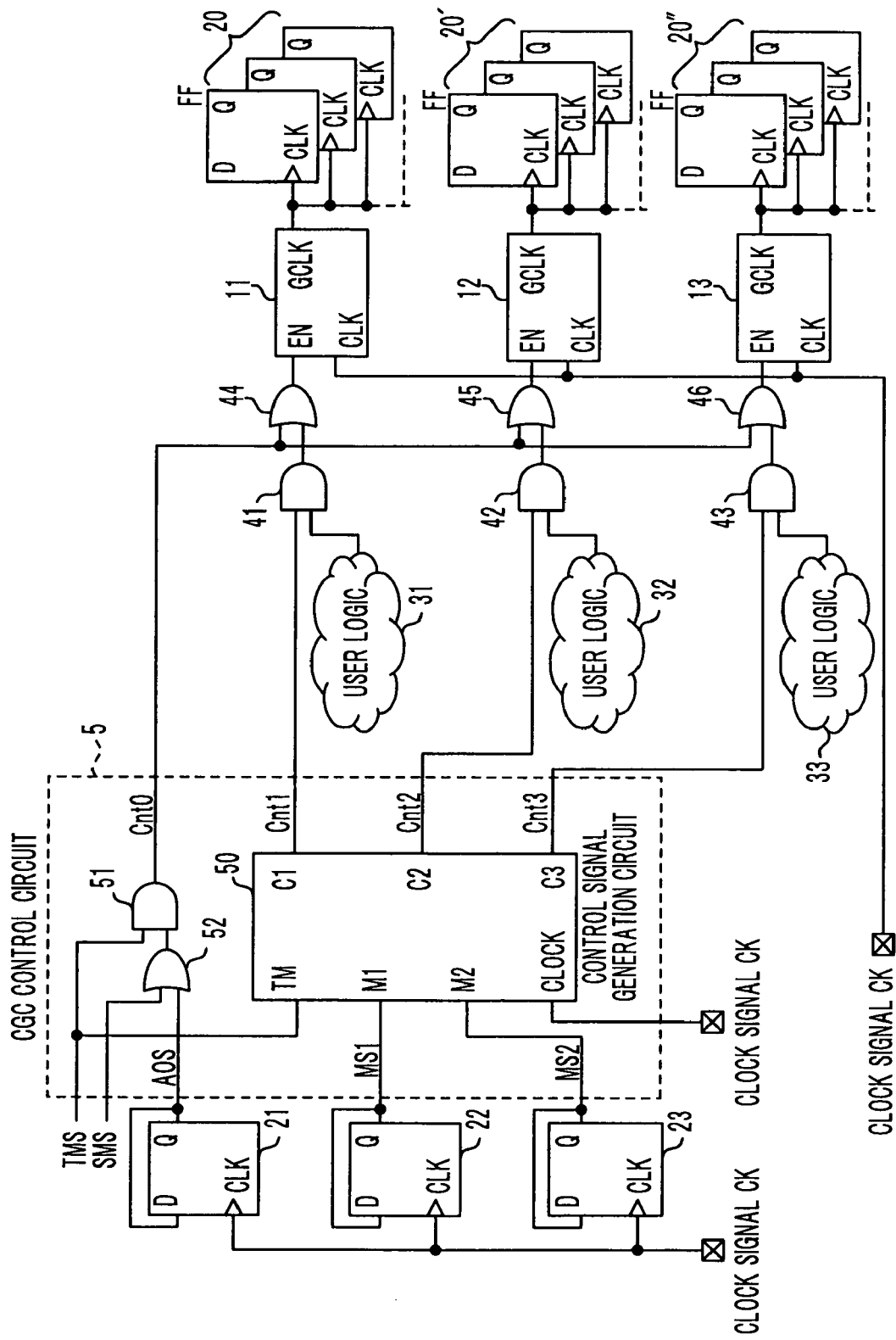
FIG. 2 illustrates an exemplary semiconductor integrated circuit according to a first exemplary embodiment.

FIG. 2 illustrates an exemplary a semiconductor integrated circuit according to an exemplary first embodiment.

In FIG. 2, reference characters 11 to 13 indicate clock gating circuits (CGC), reference characters 20, 20', and 20" indicate flip-flops (FF), and reference characters 21 to 23 indicate scan flip-flop (SFF) and 31 to 33 indicate user logics.

Reference character 5 indicates a clock gating control circuit (CGC control circuit) that controls the clock gating circuits 11 to 13, reference character 50 indicates a control signal generation circuit, reference characters 41 to 43 and 51 indicate AND gates, and reference characters 44 to 46 and 52 indicate OR gates.

FF20 indicates a plurality of flip-flops controlled by the CGC11, the FF20' indicates a plurality of flip-flops controlled by the CGC12, and the FF20" indicates a plurality of flip-flops controlled by the CGC13.

SFF21 to 23 may determine values retained by each SFF by scan shift operation according to a clock signal CK. A clock signal supplied to the control signal generation circuit 50 may be the clock signal CK or may be a different clock signal.

FIG. 2 illustrates a clock signal tree divided into three for simplifying the description, however, in actual LSI, more numerous CGCs and FFs are provided.

Upon enable terminals (EN terminals) of the CGCs11 to 13 being set to "1", the CGCs11 to 13 turn into active states and transmit clock signals CK to FF20, FF20' and FF20". Accordingly, the FF20, FF20' and FF20" capture values of input terminals D thereof.

Conversely, upon enable terminals (EN terminals) of CGC11 to CGC13 being set to "0", CGC11 to CGC13 turn into inactive states and do not transmit clock signal CK to the FF20, FF20' and FF20". Accordingly the FF20, FF20' and FF20" may not be operated.

Logic of EN terminals of the CGC11 to CGC13 and how the logic relates to active and inactive states are illustrative, and reversed logic may be applied.

As illustrated in FIG. 2, a CGC control circuit 5 may include a control signal generation circuit 50, an AND gate 51, and an OR gate 52. The CGC control circuit 5 may be controlled by five mode signals: TMS, SMS, AOS, MS1 and MS2.

The mode signals, AOS, MS1 and MS2 may be directly supplied through an external terminal of the LSI. Moreover, the mode signals AOS, MS1 and MS2 may be generated inside of the LSI without using the scan flip-flops.

FIG. 3 illustrates exemplary mode signals in a semiconductor integrated circuit according to an exemplary embodiment.

As illustrated in FIG. 3, the mode signal TMS is a test mode signal for switching between, for example, a test operation and a normal operation and "0" sets a normal operation, while "1" sets a test operation.

The mode signal SMS is a scan test mode switching signal for switching between a shift operation and a capture operation during a scan test, and "0" sets a capture operation, while "1" sets a shift operation under a test operation mode.

The mode signal MS1 is a first mode signal that controls use of the CGC control circuit 5. The user logics 31 to 33 are used upon "1" being set, and the user logics 31 to 33 and the CGC control circuit 5 are used upon "0" being set.

The mode signal MS2 is a second mode signal that determines which of a first decoder or a second decoder provided in the control signal generation circuit 50 is used. The first decoder 501 is used upon "0" being set, while the second decoder 502 is used upon "1" being set. The first decoder 501 and the second decoder 502 will be described in detail by referring to FIGS. 4 to 6.

The mode signal AOS is an all on mode signal that determines whether or not clock signals are forcibly transmitted to all FFs. Clock signals are transmitted according to the user logics 31 to 33 and a logic of the CGC control circuit 5 upon "0" being set. Clock signals are forcibly transmitted to all FFs upon "1" being set.

In FIG. 2, a mode signal TMS may be supplied to one input of the AND gate 51 and an input TM of the control signal generation circuit 50, and a mode signal SMS may be supplied to one input of the OR gate 52.

A mode signal AOS that is an output signal of the SFV21 may be supplied to the other input of the OR gate 52, and an output signal of the OR gate 52 may be supplied to the other input of the AND gate 51.

A first mode signal MS1 that is an output signal of the SFF22 may be supplied to an input M1 of the control signal generation circuit 50, and a second mode signal MS2 that is an output signal of the SFV23 may be supplied to an input M2 of the control signal generation circuit 50. A clock signal CK may be supplied to an input CLOCK of the control signal generation circuit 50.

Output signals Cnt0 of the AND gate 51 may be supplied to one input of each of the OR gates 44 to 46 respectively. Output signals of the AND gates 41 to 43 may be supplied to the other input of each of the OR gates 44 to 46 respectively.

Control signals Cnt1 to Cnt3 may be supplied to one input of each of the AND gates 41 to 43 from the control signal generation circuit 50, and the user logics 31 to 33 may be supplied to the other inputs of each of the AND gates 41 to 43 respectively.

Output signals of the OR gate 44 to 46 may be supplied to EN terminals of each of the CGC11 to CGC13. In FIG. 2, three CGC11 to CGC13 are illustrated, however, signals (signals that correspond to output signals of the OR gates 44 to 46) may be supplied to more numerous EN terminals of the CGCs.

In FIG. 2, upon the test mode signal TMS being "1", in other words, under a test operation, the control signal Cnt0 turns to "1" upon a scan test mode switching signal SMS or an all on mode signal AOS turns to "1."

As a result, the outputs of the OR gates 44, 45, and 46 become "1", and all CGCs 11 to 13 turn to active states and clock signals are transmitted to the FF20, 20', and 20" in the latter stage.

Upon both the mode signals SMS and the AOS are "0", the control signal Cnt0 turns to "0" regardless of the level of the test mode signal TMS, and outputs signals of the AND gates 41 to 43 may be supplied to the EN terminals of the CGC11 to 13 as they are.

Figure 4:
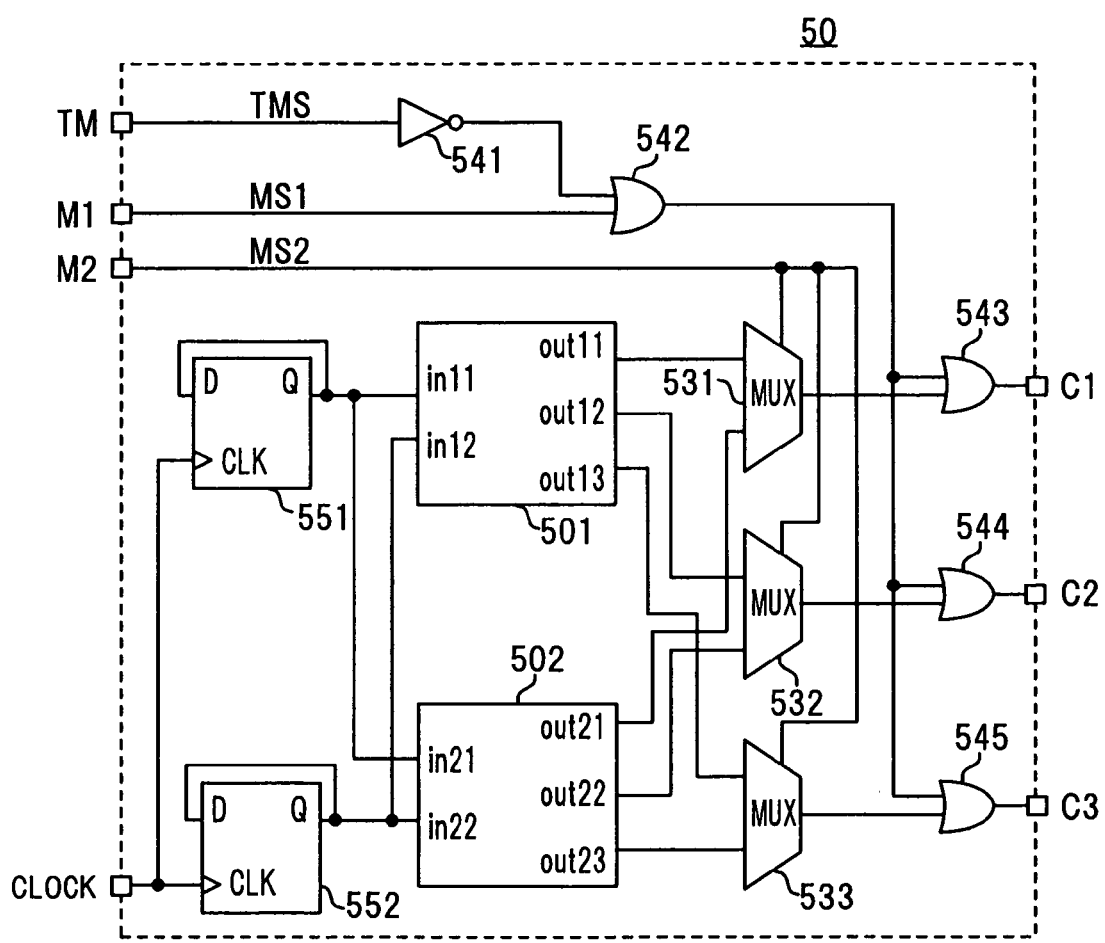
FIG. 4 illustrates an exemplary control signal generation circuit in a semiconductor integrated circuit according to a first embodiment.

FIG. 4 illustrates an exemplary control signal generation circuit 50 in the semiconductor integrated circuit. In FIG. 4, the reference character 501 indicates a first decoder, 502 indicates a second decoder, and 531 to 533 indicate multiplexers (MUX).

As illustrated in FIG. 4, the control signal generation circuit 50 may include the first decoder 501, the second decoder 502, the MUX 531 to 533, an inverter 541, OR gates 542 to 545, and SFF551 and SFF552.

The SFF551 and SFF552 may determine values retained by each SFF by scan shift operation as in the above described SFF21 to SFF23. For example, data may be set for five SFFs that are SFF551, 552, and SFF21 to 23 according to a clock signal CK.

A test mode signal TMS that is logically inverted through the inverter 541 may be supplied to one input of the OR gate 542, and a first mode signal MS1 may be supplied to the other input of the OR gate 542.

Outputs, i.e., out11 to out13 may be supplied to inputs of each of MUX531 to 533 from the first decoder 501, and outputs, i.e., out21 to out23 may be supplied to the other inputs of each of the MUX531 to 533 from the second decoder 502. A second mode signal MS2 selects and outputs either one of the outputs out11 to out13 from the first decoder 501, or outputs out21 to out23 from the second decoder 502.

Q outputs of the SFF551 and 552 may be supplied to inputs, in11 and in12 of the first decoder 501, and Q outputs of the SFF551 and 552 may be supplied to inputs, in21 and in22 of the second decoder 502.

An output signal of the OR gate 542 may be supplied to one of inputs of each of the OR gates 543 to 545, and output signals of the MUX 531 to 533 may be supplied to the other inputs of each of the OR gates 543 to 545. Accordingly, as illustrated in FIGS. 2-4, for example, a given combination of CGCs may enter an inactive state regardless of a user logic signal during a test operation mode. Thus, a number of FFs that concurrently operate can be set as desired and power consumption and IR drops are reliably reduced.

Output signals of the OR gates 543 to 545 may be supplied to the above described one input of each of the AND gates 41 to 43 as control signals Cnt1 to Cnt3 through output terminals C1 to C3.

Figures 5A, 5B:
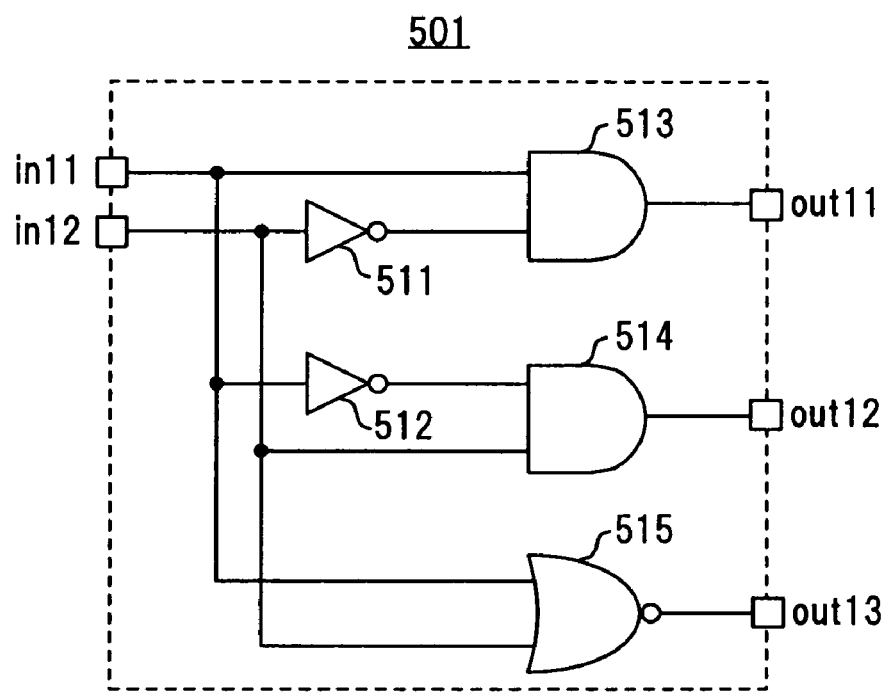
FIGS. 5A and 5B illustrate an exemplary first decoder in a control signal generation circuit.

FIGS. 5A and 5B illustrate a first decoder 501 in the control signal generation circuit illustrated in FIG. 4. FIG. 5A illustrates a truth table and FIG. 5B illustrates an example of a circuit of the first decoder 501.

As illustrated in FIG. 5A, the first decoder (1 hot decoder: 1 Hot-Decoder) 501 sets one of three outputs, i.e., out11 to out13 to "1", and the remaining two to "0", or sets all of the three to "0" by logics of inputs, i.e., in11 and in12.

As illustrated in FIG. 5B, the first decoder 501 may include, for example, inverters 511 and 512, AND gates 513 and 514, and a NOR gate 515. The circuit of the first decoder 501 is not limited to the one illustrated in FIG. 5B, and may be achieved by various circuits.

Figures 6A, 6B:
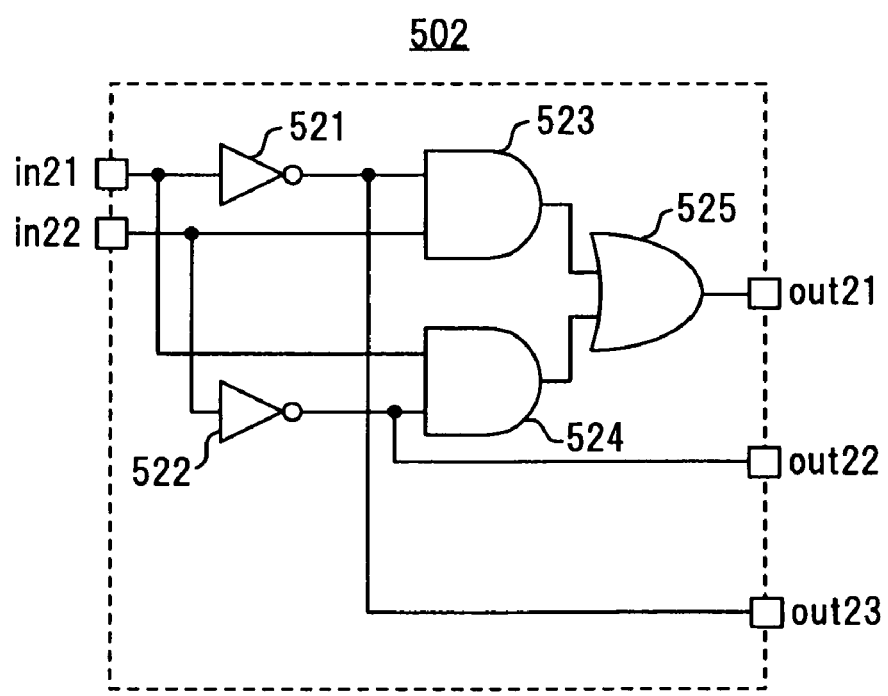
FIGS. 6A and 6B illustrate an exemplary second decoder in a control signal generation circuit.

FIGS. 6A and 6B illustrate a second decoder 502 in the control signal generation circuit 50 illustrated in FIG. 4. FIG. 6A illustrates a true table of the second decoder 502 and FIG. 6B illustrates an example of a circuit of the second decoder 502.

As illustrated in FIG. 6A, the second decoder (2 hot decoder: 2 Hot-Decoder) 502 sets two of three outputs, i.e., out21 to out23 to "1", and the remaining one to "0", or sets all of the three to "0" by logics of inputs, in21 and in22.

As illustrated in FIG. 6B, the second decoder 502 may include, for example, inverters 521 and 522, AND gates 523 and 524, and an OR gate 525. The circuit of the second decoder 502 is not limited to the one illustrated in FIG. 6B, and may be achieved by various circuits as well.

The second mode signals MS2 that may be supplied to the MUX531 to MUX533 select either outputs out11 to out13 from the first decoder 501, or outputs out21 to out23 from the second decoder 502 and supply to the other inputs of each of the OR gates 543 to 545.

Output signals of the MUX 531 to 533 become the control signals Cnt1 to Cnt3 as they are through the OR gates 543 to 545 upon the test mode signal TMS is "1" and a first mode signal MS1 is "0" to make output signals of the OR gate 542 "0."

upon the test mode signal TMS is "0", in other words, during a normal operation, an output of the OR gate become "1", and all of the control signals Cnt1 to Cnt3 become "1", and the AND gates 41 to 43 illustrated in FIG. 2 output signals of the user logics 31 to 33. The same applies to upon the first mode signal MS1 being "1."

The exemplary first embodiment divides a clock signal tree into three (example in which three CGCs are used), thus the first decoder 501 and the second decoder 502 include three outputs. For example, a decoder circuit with the number of N outputs may be used upon a clock signal tree is divided into the number of "N" (i.e., when there is the number of N CGCs).

In other words, the control signal generation circuit 50 may include a 1 hot decoder for selecting an arbitrary one of CGCs, and a 2 hot decoder for selecting arbitrary two of the CGCs, . . . , and an N−1 hot decoder for selecting arbitrary N−1 CGCs among the number of N CGCs. Each of the decoders may output the number of N decoded signals that correspond to the number of the CGCs.

For example, when N=4, the control signal generation circuit 50 may include a third decoder (3 hot decoder: 3 Hot-Decoder) that sets three outputs among four outputs to "1", and the remaining one to "0", or all of the four to "0."

A first decoder (1 hot decoder) when N=4 may set one output among four outputs to "1", and the remaining three to "0", or all of the four to "0."

A second decoder (2 hot decoder) when N=4 may set two outputs among four outputs to "1", and the remaining two to "0", or all of the four to "0."

When the control signal generation circuit 50 includes three or more decoders and the outputs of the decoders are selectively used, the mode signal MS2 may be a plurality of bits that correspond to the number of the decoders.

For example, when N=4, the control signal generation circuit 50 may not necessarily include all of the first to the third decoders depending on contents of tests, for example, when there is no need to set three outputs among four outputs to "1."

FIG. 7 illustrates a relationship between operation modes in the semiconductor integrated circuit according to an exemplary embodiment and input and output values in a control signal generation circuit. In FIG. 7, "0" indicates a low level, "L", "1" indicates a high level "H", and "X" indicates an undefined level (either a low level "L" and a high level "H" is acceptable).

As illustrated in FIG. 7, during a normal operation, setting the test mode signal TMS to "0" sets a the control signal Cnt0 to "0", and the control signals Cnt1 to Cnt3 to "1", and signals of the user logics 31 to 33 are output from the AND gate 41 to 43, as illustrated, for example, in FIG. 2. Other mode signals SMS, MS1, MS2, and AOS may be either "0" or "1" (undefined "X").

The test mode signal TMS may be set to "1" during a test operation. Data is shifted by the SFV21 to SFF23, and the SFF551 and 552 as a scan mode by setting the scan test mode switch signal SMS to "1."

The through mode sets the test mode signal TMS and the first mode signal MS1 to "1" and the scan test mode signal switching signal SMS and all on mode signal AOS to "0." The second mode signal MS2 may be undefined "X."

Accordingly, the control signal Cnt0 becomes "0", and the control signals Cnt1 to Cnt3 become "1", signals of the user logics 31 to 33 pass through the AND gates 41 to 43 and the OR gates 44 to 46, and may be supplied to the CGC11 to 13 unchange.

The 1 hot mode sets the test mode signal TMS to "1", and the second mode signal MS2, and other mode signals SMS, MS1, and AOS to "0."

As a result, output signals of the first decoder (1 hot decoder) 501, and out11 to out13 are output as control signals Cnt1 to Cnt3, and the CGC11 to 13 are controlled using the control signals Cnt1 to Cnt3 (out11 to out13) and the user logics.

A 2 hot mode sets the test mode signal TMS and the second mode signal MS2 to "1", and other mode signals SMS, MS1, and AOS to "0."

Accordingly, outputs signals out21 to out23 of the second decoder (2 hot decoder) 502 are output as the control signals Cnt1 to Cnt3, and the CGC11 to 13 are controlled using the control signals Cnt1 to Cnt3 (out21 to out23) and the user logics.

The active mode sets the test mode signal TMS and the all on mode signal AOS to "1", and sets the scan test mode switching signal SMS to "SMS" to "0." Other mode signals, MS1 and MS2 may be undefined "X."

Accordingly, all of the CGC11 to 13 turn to active states and clock signals may be supplied to all of the FF20, 20', and 20" substantially simultaneously. The mode signals AOS, MS1, and MS2 may be switched by changing setting values of the SFF21 to 23.

As described above, according to a first embodiment, arbitrary combination of the CGCs may be set to an inactive state during a test mode operation regardless of signals of user logics. Thus, the number of FFs that operate substantially simultaneously may be set freely, and power consumption and IR drop may be suppressed.

Using a control signal generation circuit with a simple configuration for controlling CGCs allows reduction of load for software that generates test patterns, and thereby time for generating test patterns and the number of test patterns may be reduced.

Figure 8:
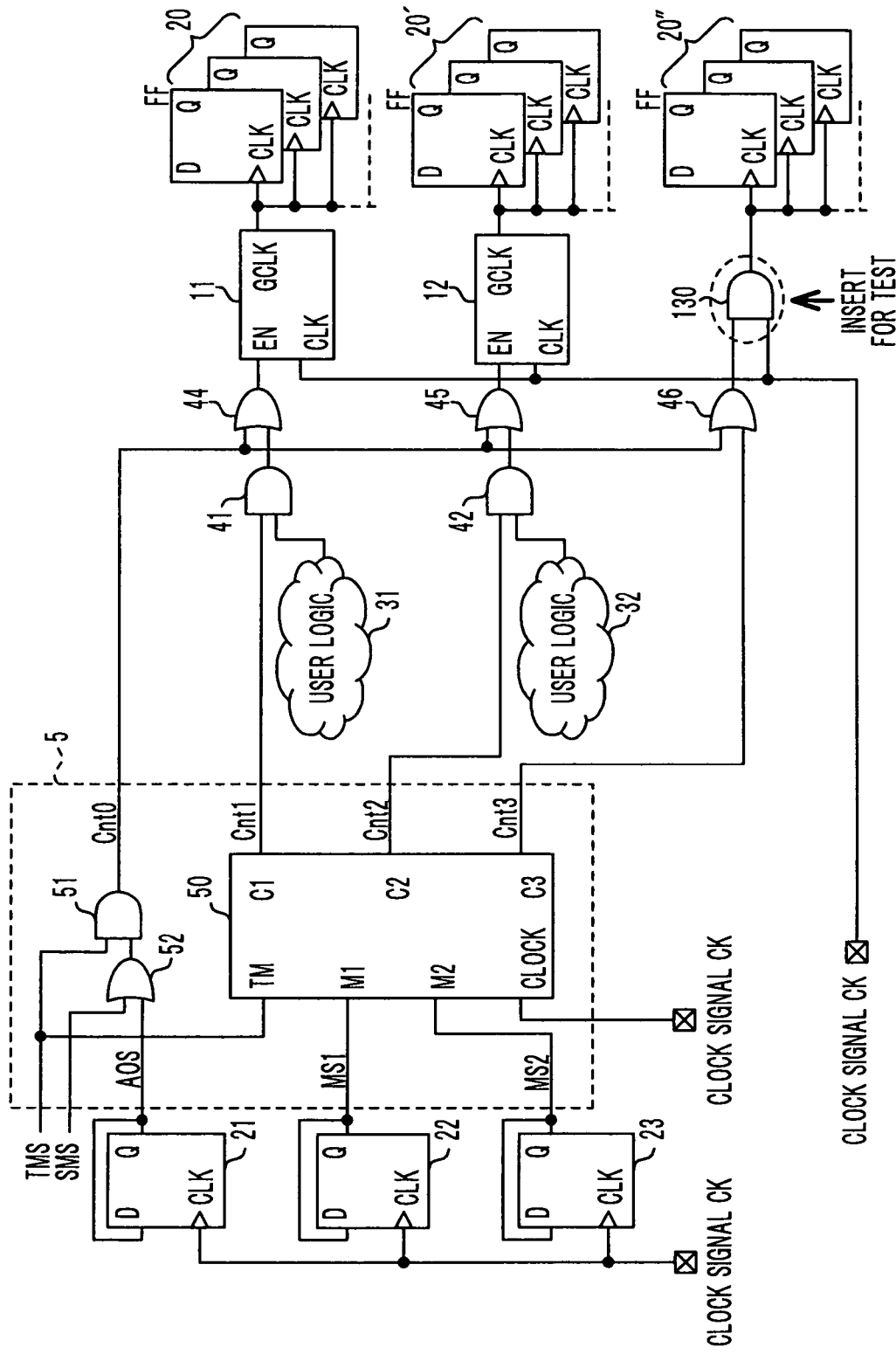
FIG. 8 illustrates an exemplary semiconductor integrated circuit according to a second embodiment.

FIG. 8 illustrates an exemplary semiconductor integrated circuit according to a second embodiment.

As the comparison between FIG. 8 and FIG. 2 reveals, in a second exemplary embodiment, an AND gate 130 may be provided for a plurality of flip-flops 20" that receive clock signals CK without passing through CGCs (clock direct reception flip-flops).

In other words, when there is no need to operate a flip-flop 20" under a test operation mode, an output signal of the AND gate 130 may be set to "0" by setting a control signal Cnt3 from the control signal generation circuit 50 and a control signal Cnt0 from the AND gate 51 to "0."

Figure 9:
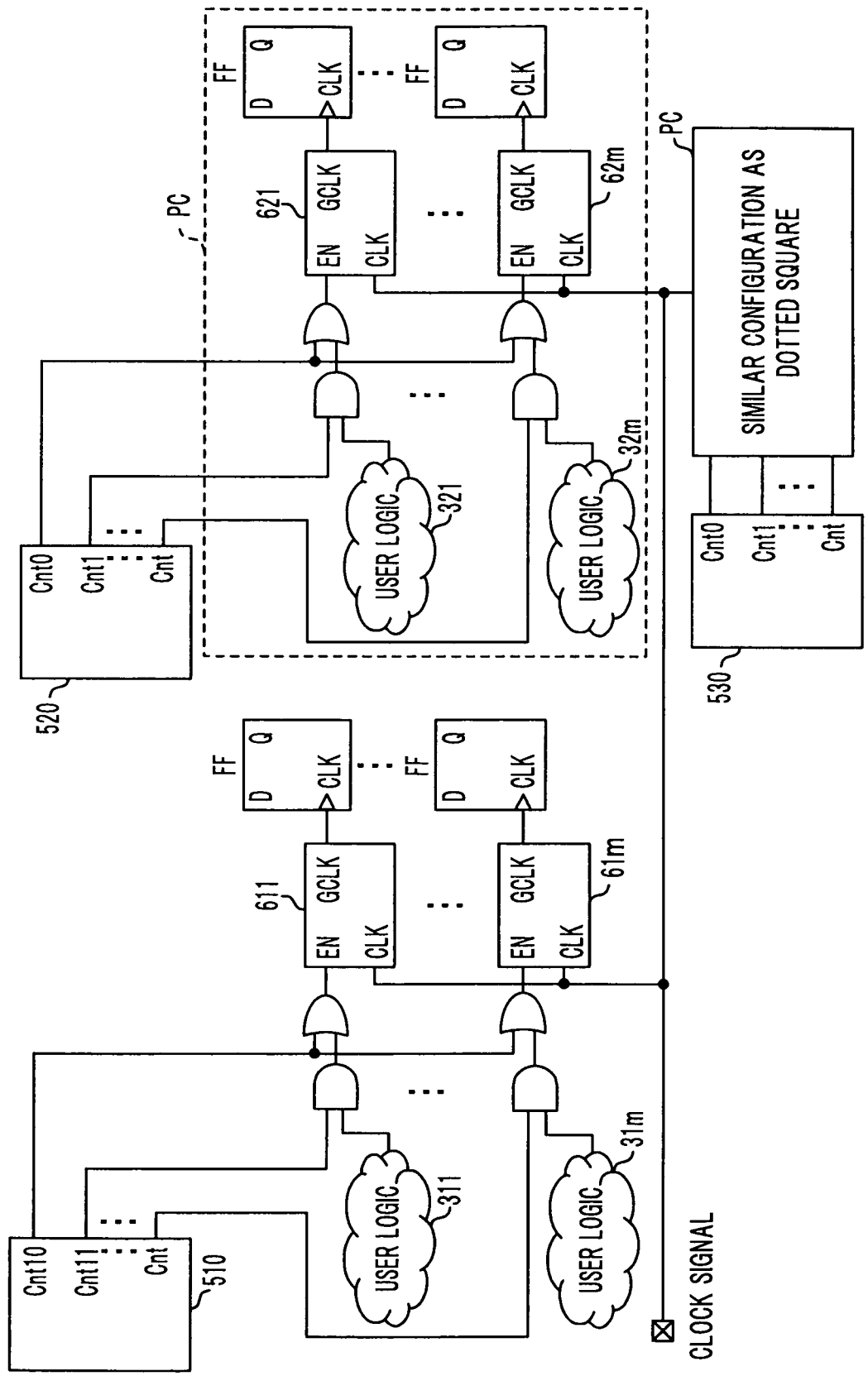
FIG. 9 illustrates an exemplary semiconductor integrated circuit according to a third embodiment.

An IR drop may be further suppressed by stopping supply of clock signals to flip-flops without CGCs during a test operation mode. Accordingly, power consumption and IR drops can be further reduced by stopping a supply of clock signals generated in a test operation mode to FFs that include no CGC FIG. 9 illustrate an exemplary semiconductor integrated circuit according to a third embodiment. In FIG. 9, reference characters 311 . . . 31m, and 321 . . . 32m indicate user logics, reference characters 611 . . . 61m, and 621 . . . 62m indicate CGC, and the reference characters 510, 520, and 530 indicate CGC control circuits.

A circuit PC that is controlled by the CGC control circuit 530 is substantially the same as a circuit PC controlled by the CGC circuit 520.

As FIG. 9 illustrates, when a semiconductor integrated circuit includes many CGCs, the CGCs may be divided into two or more groups and each of the groups may be provided with a CGC control circuit. For example, according to an exemplary embodiment, upon a semiconductor integrated circuit including a large number of CGCs, the CGCs may be divided into a plurality of groups and for each group, the CGC control circuit 510, 520, or 530 may be provided.

For example, when nine CGCs are provided (when N=3), the nine CGCs may be divided into three groups and a CGC control circuit is provided for each of the CGC group instead of providing one CGC control circuit for the nine CGC circuits. In other words, three CGC control circuits are provided and each of the CGC control circuits may control each of the three CGCs.

As a result, output signals of decoders provided in the control signal generation circuit of the CGC control circuit are reduced, and thereby a size of the entire CGC control circuit may be reduced and power consumption and an IR drop may further be reduced.

The mode signals TMS, SMS, AOS, MS1, and MS2 are exemplary and various mode signals may be used and the logics may not be limited to the above described embodiments.

The logic gates 41 to 46, 541 to 545, and the first decoder 501 and the second decoder 502 in the control signal generation circuit 50 are exemplary, and various elements may be applied.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor integrated circuit comprising:
   a plurality of clock gating circuits;
   a plurality of flip-flops to which transmission of a clock signal is controlled by a respective clock gating circuit; and
   a clock gating control circuit that controls an active state and an inactive state of the plurality of clock gating circuits, wherein during a test operation mode, the clock gating control circuit controlling the active state and the inactive state of the plurality of clock gating circuits according to a user logic signal, and controlling setting of an arbitrary combination of clock gating circuits to an inactive state regardless of the user logic signal.

2. The semiconductor integrated circuit according to claim 1, the clock gating control circuit including a control signal generation circuit that generates a control signal for defining the arbitrary combination of clock gating circuits that are set to an inactive state during the test mode operation regardless of the user logic signal.

3. The semiconductor integrated circuit according to claim 2, the semiconductor integrated circuit being set to a given mode according to a plurality of mode signals; and the control signal generation circuit generates the control signal according to the plurality of the mode signals.

4. The semiconductor integrated circuit according to claim 3, wherein the plurality of mode signals include a test mode signal that switches between a test operation and a normal operation, a scan test mode switch signal that switches a shift operation and a capture operation during a scan test, and signals that set the control signal output from the clock gating control circuit.

5. The semiconductor integrated circuit according to claim 3, further comprising a plurality of first scan flip-flops that set the plurality of mode signals.

6. The semiconductor integrated circuit according to claim 2, further comprising:
   a first logic circuit that supplies one of a signal from the user logic and a signal that sets an arbitrary combination of clock gating circuits to an inactive state to each enable terminal of the plurality of clock gating circuits during the test mode operation.

7. The semiconductor integrated circuit according to claim 1, wherein upon a number of the plurality of clock gating circuits being a number N, the control signal generation circuit further comprising:
   a first decoder that selects an arbitrary one of clock gating circuits among the number of N clock gating circuits,
   a second decoder that selects arbitrary two clock gating circuits among the number of N clock gating circuits; and
   an N−1 decoder that selects the number of arbitrary N−1 clock gating circuits.

8. The semiconductor integrated circuit according to claim 7, wherein the control signal generation circuit includes a selection circuit that selects an output signal of one decoder among the first to the N−1 decoders and output as the control signal.

9. The semiconductor integrated circuit according to claim 7, wherein the control signal generation circuit includes a plurality of a second scan flip-flops that set signals that are supplied to the first to the N−1 decoders.

10. The semiconductor integrated circuit according to claim 2, further comprising:
    a plurality of direct reception flip-flops that receive the clock signal directly without passing through a clock gating circuit; and
    a second logic circuit that is provided at an enable terminal of the direct reception flip-flop and performs a logical operation on the clock signal and the control signal.

11. The semiconductor integrated circuit according to claim 1, wherein the plurality of the clock gating circuits are divided into a plurality of groups, a plurality of the clock gating circuits are provided, and each of the clock gating control circuits controls the divided each group of the clock gating circuits.

12. A method for testing a semiconductor integrated circuit that includes a plurality of clock gating circuits and a plurality of flip-flops to which transmission of a clock signal is controlled by the clock gating circuit comprising;
    during the test mode operation, controlling an active state and an inactive state of the plurality of clock gating circuits according to a user logic signal and controlling a setting of an arbitrary combination of clock gating circuits to an inactive state regardless of the user logic signal.

13. The method for testing the semiconductor integrated circuit according to claim 12, wherein the semiconductor integrated circuit is set to a given mode according to a plurality of mode signals and during the test mode operation, the arbitrary combination of clock gating circuits that is set to the inactive state regardless of the user logic signal is controlled according to the plurality of mode signals.

14. The method for testing the semiconductor integrated circuit according to claim 13, wherein the plurality of mode signals include a test mode signal for switching between a test operation and a normal operation, a scan test mode switch signal for switching between a shift operation and a capture operation during a scan test, and a plurality of mode signals that set the control signal output from the clock gating circuit.

15. The method for testing the semiconductor integrated circuit according to claim 12, further comprising:
    dividing the plurality of clock gating circuits into a plurality of groups, and
    during a test mode operation, in each of the groups, performing one of controlling the clock gating circuits of each group to an active state and an inactive state according to the user logic signal and setting an arbitrary combination of clock gating circuits to an inactive state regardless of the user logic signal.

16. A non-transitory computer-readable computer medium including a program that when executed causes a computer to execute a testing a circuit comprising;
    controlling a state of a plurality of clock gating circuits according to a user logic signal; and
    controlling a setting of an arbitrary combination of clock gating circuits to an inactive state regardless of the user logic signal.

* * * * *

UNITED STATES PATENT AND TRADEMARK OFFICE
CERTIFICATE OF CORRECTION

| | | |
|---|---|---|
| PATENT NO. | : 7,872,490 B2 | Page 1 of 1 |
| APPLICATION NO. | : 12/659760 | |
| DATED | : January 18, 2011 | |
| INVENTOR(S) | : Masayasu Fukunaga et al. | |

It is certified that error appears in the above-identified patent and that said Letters Patent is hereby corrected as shown below:

Title Page Column 1 (Inventors), Line 2 delete "Yokahama" and insert -- Yokohama --, therefor.

Signed and Sealed this
Nineteenth Day of April, 2011

David J. Kappos
*Director of the United States Patent and Trademark Office*